US012534345B2

(12) United States Patent
Chiu et al.

(10) Patent No.: US 12,534,345 B2
(45) Date of Patent: Jan. 27, 2026

(54) MODULAR AND COLLAPSIBLE SERVER LIFT ASSIST FOR IMMERSION COOLING SYSTEM

(71) Applicant: Google LLC, Mountain View, CA (US)

(72) Inventors: Jerry Chiu, Pacifica, CA (US); Evan Fraisse, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 234 days.

(21) Appl. No.: 17/714,582

(22) Filed: Apr. 6, 2022

(65) Prior Publication Data

US 2023/0322528 A1 Oct. 12, 2023

(51) Int. Cl.
*B66C 19/02* (2006.01)
*B66C 17/04* (2006.01)
*H05K 7/20* (2006.01)

(52) U.S. Cl.
CPC .............. *B66C 19/02* (2013.01); *B66C 17/04* (2013.01); *H05K 7/203* (2013.01)

(58) Field of Classification Search
CPC ....... B66C 19/02; B66C 19/00; B66C 19/005; B66C 19/007; B66C 17/00; B66C 17/06
See application file for complete search history.

(56) References Cited

U.S. PATENT DOCUMENTS

| | | | | |
|---|---|---|---|---|
| 655,522 | A * | 8/1900 | Seaver | B66C 9/14 212/315 |
| 4,664,270 | A | 5/1987 | Voelz | |
| 8,756,826 | B2 | 6/2014 | Gibbel | |
| 9,655,279 | B2 | 5/2017 | Pelletier et al. | |
| 10,123,453 | B2 | 11/2018 | Saito | |
| 10,306,799 | B2 | 5/2019 | Saito | |
| 10,401,924 | B2 * | 9/2019 | Saito | B66D 3/26 |
| 10,477,726 | B1 | 11/2019 | Enright et al. | |
| 10,481,650 | B2 | 11/2019 | Saito | |
| 10,614,925 | B2 * | 4/2020 | Carver | B66C 19/005 |
| 10,645,841 | B1 | 5/2020 | Mao et al. | |
| 10,791,647 | B1 | 9/2020 | Miyamura et al. | |
| 11,134,586 | B2 | 9/2021 | Enright et al. | |
| 11,160,194 | B2 | 10/2021 | Lau | |

(Continued)

FOREIGN PATENT DOCUMENTS

| | | | |
|---|---|---|---|
| CN | 2589903 | Y | 12/2003 |
| CN | 103056874 | B | 5/2015 |

(Continued)

OTHER PUBLICATIONS

Extended European Search Report for European Patent Application No. 22206838.9 dated Sep. 6, 2023. 9 pages.

(Continued)

*Primary Examiner* — Victoria P Augustine
*Assistant Examiner* — Nathaniel L Adams
(74) *Attorney, Agent, or Firm* — Lerner David LLP

(57) ABSTRACT

A gantry crane for attachment to an immersion cooling system includes rails attachable to a tank of the immersion cooling system. The gantry also includes a collapsible frame configured to travel along the rails. A connector is adapted for connecting to a computer hardware component intended to be cooled in the immersion cooling system, and the gantry includes a winch mounted to the frame and configured to raise and lower the connector.

13 Claims, 9 Drawing Sheets

(56) References Cited

U.S. PATENT DOCUMENTS

| | | | | |
|---|---|---|---|---|
| 2007/0056922 | A1* | 3/2007 | Ciaburro | B66C 19/02 212/175 |
| 2007/0163982 | A1 | 7/2007 | Lichinchi | |
| 2012/0298939 | A1* | 11/2012 | Andrews | B66C 23/205 254/390 |
| 2014/0301037 | A1 | 10/2014 | Best | |
| 2016/0265846 | A1 | 9/2016 | Tice | |
| 2018/0303008 | A1 | 10/2018 | Shen | |
| 2019/0177132 | A1* | 6/2019 | Weddel | B66C 17/06 |
| 2019/0208664 | A1 | 7/2019 | Saito | |
| 2020/0089293 | A1 | 3/2020 | Enright et al. | |
| 2020/0093024 | A1 | 3/2020 | Enright et al. | |
| 2020/0093025 | A1 | 3/2020 | Enright et al. | |
| 2020/0093026 | A1 | 3/2020 | Enright et al. | |
| 2020/0093037 | A1 | 3/2020 | Enright et al. | |
| 2020/0093038 | A1 | 3/2020 | Enright et al. | |
| 2021/0144885 | A1 | 5/2021 | Enright et al. | |
| 2021/0153386 | A1 | 5/2021 | Lau | |
| 2021/0300732 | A1* | 9/2021 | Lipkowski | B66C 19/02 |

FOREIGN PATENT DOCUMENTS

| | | | | |
|---|---|---|---|---|
| CN | 105353848 | A | 2/2016 | |
| CN | 106395617 | A | 2/2017 | |
| CN | 107120915 | A | 9/2017 | |
| CN | 108217447 | A | 6/2018 | |
| CN | 108292151 | A | 7/2018 | |
| CN | 108882652 | A | 11/2018 | |
| CN | 108901187 | A | 11/2018 | |
| CN | 104991623 | B | 2/2019 | |
| CN | 109618538 | A | 4/2019 | |
| CN | 209815510 | U | 12/2019 | |
| CN | 211198386 | U | 8/2020 | |
| CN | 212769472 | U | 3/2021 | |
| CN | 213537050 | U | 6/2021 | |
| CN | 110753474 | B | 9/2021 | |
| EP | 2589903 | A1 | 5/2013 | |
| EP | 3726945 | A1 | 10/2020 | |
| FR | 2420502 | A1 * | 10/1979 | B66C 19/02 |
| GB | 2506183 | A | 3/2014 | |
| GB | 2588842 | A | 5/2021 | |
| KR | 101492559 | B1 | 2/2015 | |
| KR | 20220005450 | A | 1/2022 | |
| TW | 201830409 | A | 8/2018 | |
| WO | 2013063705 | A1 | 5/2013 | |

OTHER PUBLICATIONS

Office Action For Taiwan Patent Application No. 112106207 dated Apr. 7, 2025. 11 pages.

Office Action for Chinese Patent Application No. 202310086629.1 dated May 23, 2025. 11 pages.

Office Action for Chinese Patent Application No. 202310086629.1 dated Oct. 15, 2025. 10 pages.

* cited by examiner

MODULAR AND COLLAPSIBLE SERVER LIFT ASSIST FOR IMMERSION COOLING SYSTEM

BACKGROUND

Information technology ("IT") or computing equipment generates heat during operation and tends to operate better and fail at lower rates when cooled. For this reason, cooling systems for computing equipment have been developed. One type of cooling system is an immersion cooling system having a tank of evaporable liquid and a condenser, the condenser typically being located above evaporable dielectric fluid, for extracting heat from and condensing vapor that rises from the tank.

Adding or removing hardware can be time consuming and difficult. Larger computer hardware components can be heavy and cumbersome, making them slow, hazardous, or even impossible for some data center workers to carry. Temperatures inside immersion cooling systems can be too high for unprotected access. Before reaching into the tank, personnel may therefore need to stop the operation of the hardware in the system to allow the system to cool down, wear protective equipment, or both. These precautions are particularly disruptive for cooling systems installed in environments where protective equipment is usually unnecessary, such as typical datacenters.

BRIEF SUMMARY

Cost, operating efficiency, and ease for immersion cooling systems could be improved by reducing the need for manual lifting and depositing of computer hardware.

Aspects of this disclosure are directed to a gantry for immersion cooling tanks. The gantry may optionally be removably mountable to the tanks. The gantry may include a frame for holding a connector aloft, rails for supporting the frame, and a winch for raising and lowering the connector. The connector may be movable along the frame, and the frame itself may be movable along the rails. The connector may therefore be movable to be aligned above multiple possible locations where computer hardware components are intended to be deposited in the tank. The connector may also be movable between locations over the tank and locations that are not over the tank, such as locations over an aisle adjacent to the tank. The rails may be removably connectable or permanently integrated to the frame. The frame may be foldable or collapsible from an expanded configuration intended to be used when the gantry is operational to a collapsed or folded configuration that occupies less space. The gantry may be manually operable, motorized, or both. Motorized aspects of the gantry may be digitally controlled, such as by a computer or programmable controller unit.

In another aspect, a gantry crane for attachment to an immersion cooling system may comprise rails attachable to a tank, a collapsible frame configured to travel along the rails, a connector adapted for connecting to a computer hardware component, and a winch mounted to the frame and configured to raise and lower the connector.

In some examples according to any of the foregoing, the connector may be a bracket.

In some examples according to any of the foregoing, the connector may be a pair of jaws.

In some examples according to any of the foregoing, rails may be extendable.

In some examples according to any of the foregoing, each of the rails may include a fixed track, and the frame includes a movable track for each fixed track, and each movable track is movably connected to a respective one of the fixed tracks.

In some examples according to any of the foregoing, the frame may comprise two supports and a bridge, the supports are each pivotably connected to the bridge at a different location, and the connector hangs from the bridge.

In some examples according to any of the foregoing, the connector may be movable along the bridge.

In some examples according to any of the foregoing, the connector may be movable along the bridge in a first direction that is perpendicular to a second direction in which the frame may travel along the rails.

In some examples according to any of the foregoing, the bridge may include an upper beam to which both of the supports are connected and a lower beam to which the connector is connected that hangs from the upper beam, wherein the winch is configured to raise and lower the lower beam relative to the upper beam.

In some examples according to any of the foregoing, the supports may each include a first end pivotably connected to the bridge and a second end that is opposite the first end and configured to travel along one of the rails.

In some examples according to any of the foregoing, each second end may be connected to a respective one of the rails.

In some examples according to any of the foregoing, the gantry may comprise a bar extending between the bridge and one of the supports.

In some examples according to any of the foregoing, the bar may be collapsible.

In some examples according to any of the foregoing, the gantry may comprise at least one hook attached to each of the rails and positioned to extend toward another of the rails when the gantry crane is in a deployed configuration.

In another aspect, method of repositioning a computer hardware component may comprise removably mounting a gantry crane system that includes a winch to an immersion cooling tank. The method may also comprise using the winch to lift the computer hardware component while the gantry crane system is mounted to the immersion cooling tank.

In some examples according to any of the foregoing, the method may comprise unfolding a frame of the gantry crane system from a collapsed state to a deployed state.

In some examples according to any of the foregoing, the gantry crane system may include two rails and the frame that includes a bridge and two supports pivotably mounted to the bridge. Each rail may be connected to a respective one of the supports. The rails may be farther from the bridge when the frame is in the deployed state than when the frame is in the collapsed state.

In some examples according to any of the foregoing, the method may comprise, while the gantry crane system is mounted to the immersion cooling tank, causing a frame of the gantry crane system from which a connector of the winch hangs to travel along a first axis between a location at which the connector is above the immersion cooling tank and a location at which the connector is not above the immersion cooling tank.

In some examples according to any of the foregoing, the frame may include a hang point from which the connector hangs. The method may also comprise, while the gantry crane system is mounted to the immersion cooling tank, causing the hang point to travel along a second axis that is perpendicular to the first axis.

In some examples according to any of the foregoing, the method may comprise removably mounting the gantry crane system to the immersion cooling tank includes attaching two rails along which the frame can travel to opposite sides of the immersion cooling tank, and the rails each extend parallel to the first axis when the gantry crane system is mounted to the immersion cooling tank.

DETAILED DESCRIPTION

All directional terms, such as "up," "down," "above," "below," "vertical," or "height" used in the following description refer only to the orientation of features as depicted in the figure being described. Such directional terms are not intended suggest that any features of the devices described herein must exist in any particular orientation when constructed.

Figure 1A:
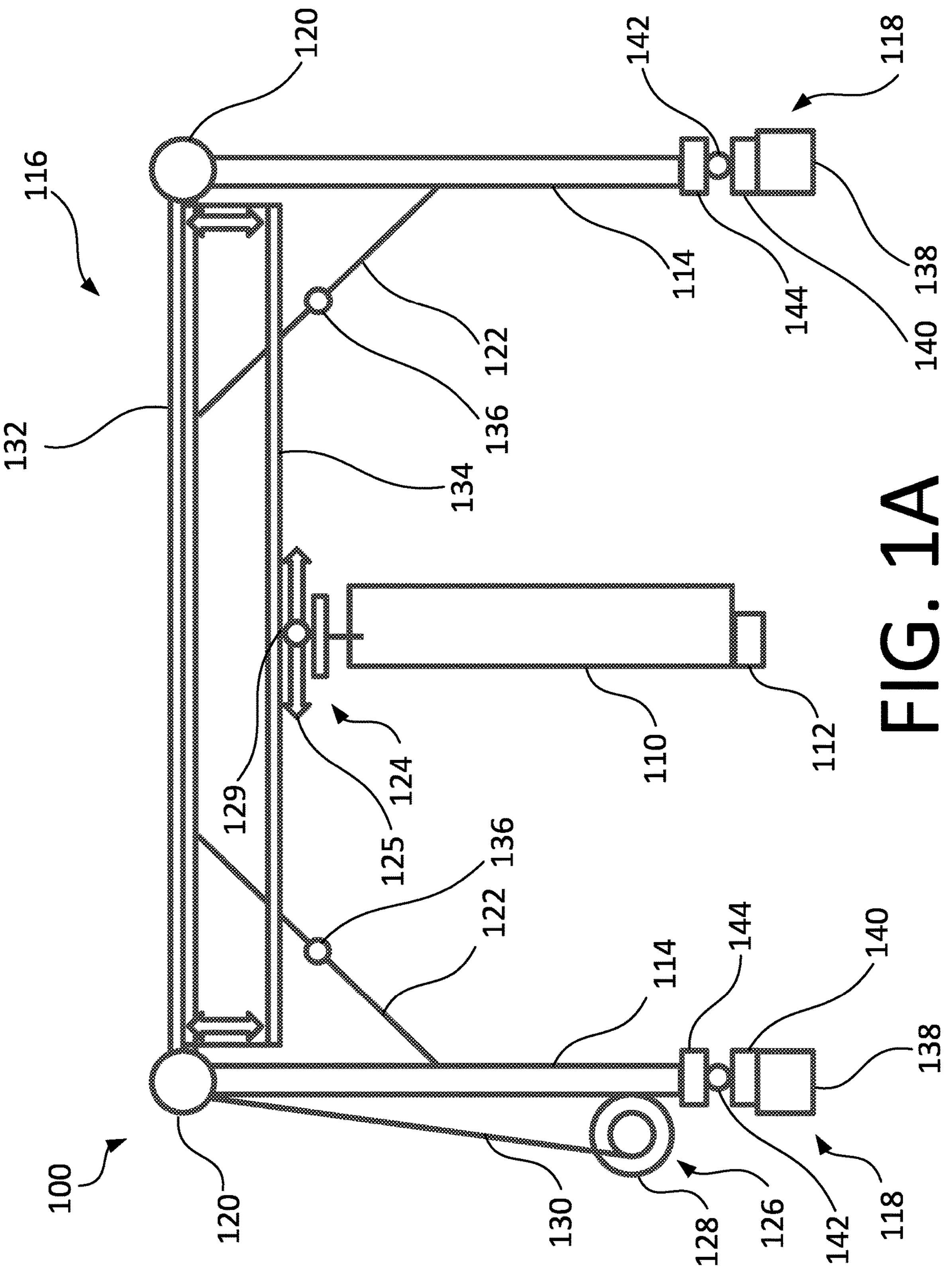
FIG. 1A is a side elevation view of a gantry.
Figure 1B:
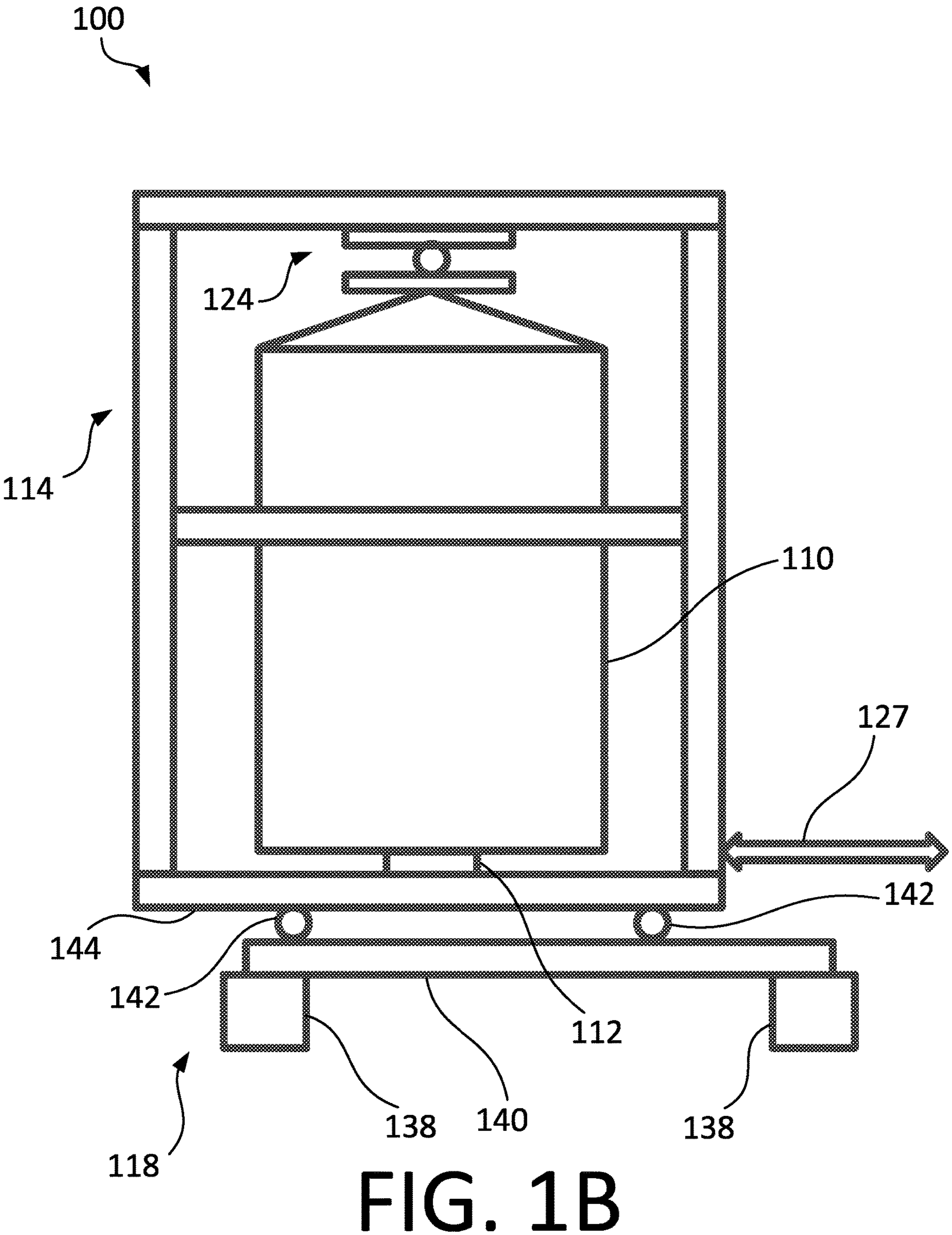
FIG. 1B is a front elevation view of the gantry of FIG. 1A.

FIGS. 1A and 1B show a gantry crane system 100, referred to hereinafter as gantry 100. Gantry 100 includes a frame that, in turn, includes supports 114 that support a bridge 116. Gantry 100 also includes rails 118, above which bridge 116 is supported by supports 114, a connector 124 that is movable along bridge 116, and a winch 126. Gantry 100 is configured to enable lifting and transport of a computer hardware component 110 by use of connector 124 to connect to component 110, or a housing or harness for component 110, and winch 126 to move connector 124.

Connector 124 may be, for example, a hook, a bracket, a loop, a pair of jaws, or any other mechanism capable of readily connecting to and disconnecting from component 110 or a housing or harness for component 110.

Rails 118 may optionally be removably attachable to a tank of an immersion cooling system. Examples wherein rails are removably attachable to a tank enable gantry 100 to be applied to otherwise unmodified or lightly modified immersion cooling systems, Gantries 100 according to such examples may therefore be supplied for use with existing immersion cooling systems to improve ease of use of those immersion cooling systems. The releasable attachment of rails 118 may be enabled, for example, by hooks attached to or integrated with rails 118 for hooking over the upper edges of the immersion cooling tank, brackets attached to or integrated with rails 118 configured to releasably attach to features of the tank, brackets attached to the tank for receiving rails 118, or any other mechanism suitable for releasably attaching rails 118 to the tank. In other examples, rails 118 may be permanently installed on the tank. In any case, uprights 114 may optionally be separable from rails 118.

Winch 126 of the illustrated example includes a spool 128 and a tether 130. Tether 130 can be wound and unwound about spool 128 by turning spool 128 in either direction about an axis of rotation. Winch 126 may be motorized, configured to manual operation, or both. In examples wherein winch 126 is motorized, the motor may be manually operable, computer controlled, or both. In examples other than the illustrated example, winch 126 may include mechanisms for selectively drawing or releasing tether 130 other than spool 128.

Bridge 116 of the illustrated example 116 includes an upper beam 132 and a lower beam 134. Lower beam 134 is configured to be raised and lowered relative to upper bar 132 as winch 126 pulls and loosens tether 130, respectively. Connector 124 hangs from a hang point 129 on lower beam 134, so raising or lowering lower beam 134 causes connector 124 to ascend or descend, respectively. When component 110 is connected to connector 124, winch 126 can be used to raise and lower component 110 by raising and lowering lower beam 134.

Connector 124 is movable along bridge 116 on a first horizontal axis 125. In the illustrated example, connector 124 is movable along bridge 116 by movement of hang point 129 along lower beam 134, but in other examples hang point 129 may be located on and movable along another part of bridge 116. Also according to the illustrated example, first horizontal axis 125 ascends and descends along with lower beam 134, though in other examples first horizontal axis 125 may remain at a constant elevation and connector 124 may be able to ascend and descend relative to hang point 129. The connector 124 and hang point 129 may be manually movable, movable with a motor or both, and the motor may be manually controllable, controlled by a computer, or both.

The frame of gantry 100 is movable along rails 118 along a second horizontal axis 127. Second horizontal axis 127 is perpendicular to first horizontal axis 125 in the illustrated example, though in other examples, the first and second horizontal axes 125, 127 may be at smaller angles relative to one another.

In the illustrated example, rails 118 each include attachment blocks 138, which may include any of the above described features for attaching rails 118 to a tank of an immersion cooling system, and a track 140. Though each rail 118 of the illustrated example includes two attachment blocks 138, rails 118 according to other examples may include attachment blocks 118 in any other quantity. In other examples the attachment features may be connected to or integrated with tracks 140, and attachment blocks 138 may be omitted.

Supports 114 each include a lower end 144. Wheels 142 between each lower end 144 and respective track 140 enable movement of the frame of gantry 100 along rails 118.

Figure 1C:
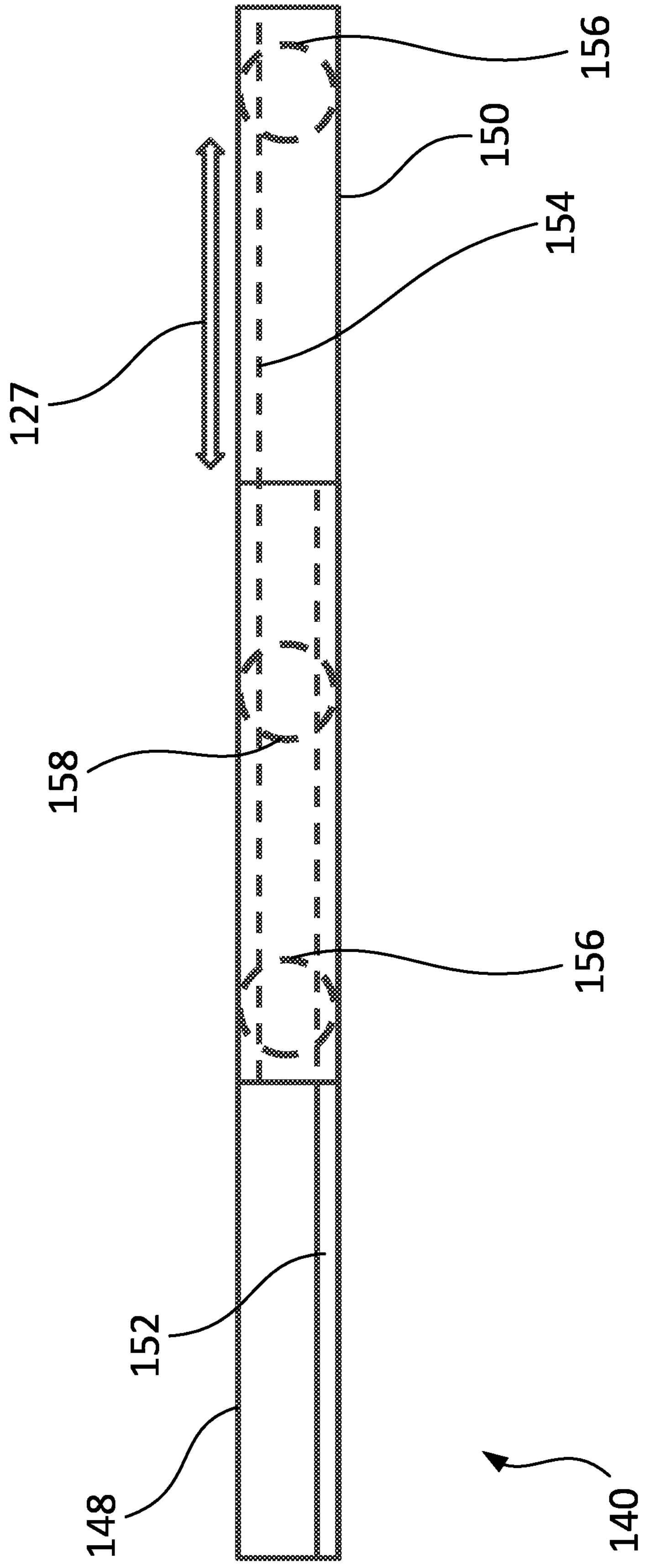
FIG. 1C is a front elevation view of a rail of the gantry of FIG. 1A according to a first example.

As shown in FIG. 1C, rails 118 and tracks 140 according to the illustrated example are extendable. Each track 140 includes a fixed portion 148, which may be fixed relative to the tank of an immersion cooling system, and a movable portion 150 that can travel along fixed portion 148 along second horizontal axis 127. Wheels 142 can roll along movable portion 150, so the ability of movable portion 150 to move along second horizontal axis 127 relative to fixed portion 148 increases the overall range along second horizontal axis 127 that the frame and connector 124 of gantry 100 can travel relative to the tank of an immersion cooling system to which gantry 100 is attached.

In the illustrated example, travel of movable portion 150 along fixed portion 148 is facilitated by movable wheels 156 and fixed wheel 158. Movable wheels 156 are rotatably attached to movable portion 150, while fixed wheel 158 is rotatably attached to fixed portion 148. Fixed portion 148 includes a fixed flange 152 along which movable wheels 156 roll when movable portion 150 travels along fixed portion 148, and movable portion 150 includes a movable flange 154 along which fixed wheel 158 rolls when movable portion 150 travels along fixed portion 148. The quantities of movable wheels 156 and movable wheels 158 may differ in other examples. In yet further examples, travel of movable portion 150 along fixed portion 148 may be facilitated by different mechanisms altogether.

Figure 1D:
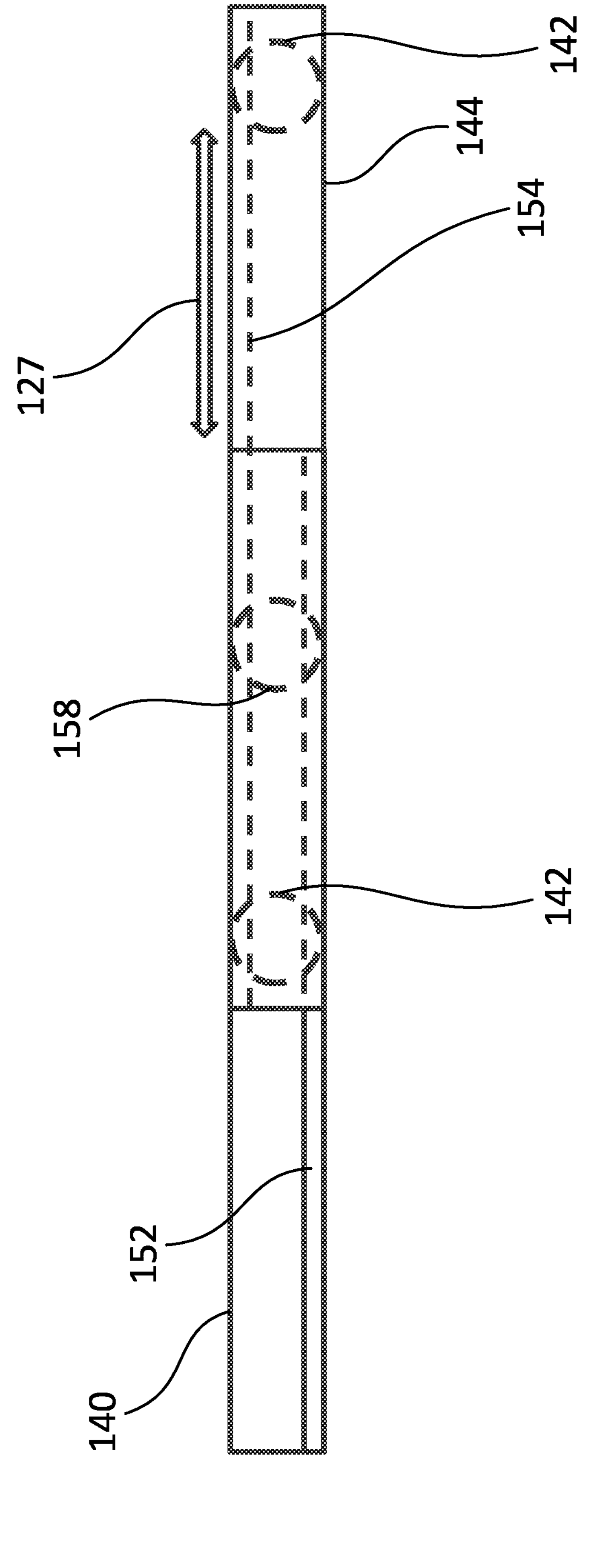
FIG. 1D is a front elevation view of a rail of the gantry of FIG. 1B according to a second example.

As shown in FIG. 1D, in another example, instead of rail 118 itself being extendable as described above, lower ends 144 may be able to extend from tracks 140 in a manner similar to movable portion 150 described above. Thus, in the example illustrated in FIG. 1D, instead of each track 140 including a fixed portion 148 and a movable portion 150, each track 140 is merely fixed relative to the tank of an immersion cooling system. Further according to the example illustrated in FIG. 1D, each lower end 144 may travel along its respective track 140 in a manner similar to the travel of movable portion 150 along fixed portion 148 as described above.

Figure 1E:
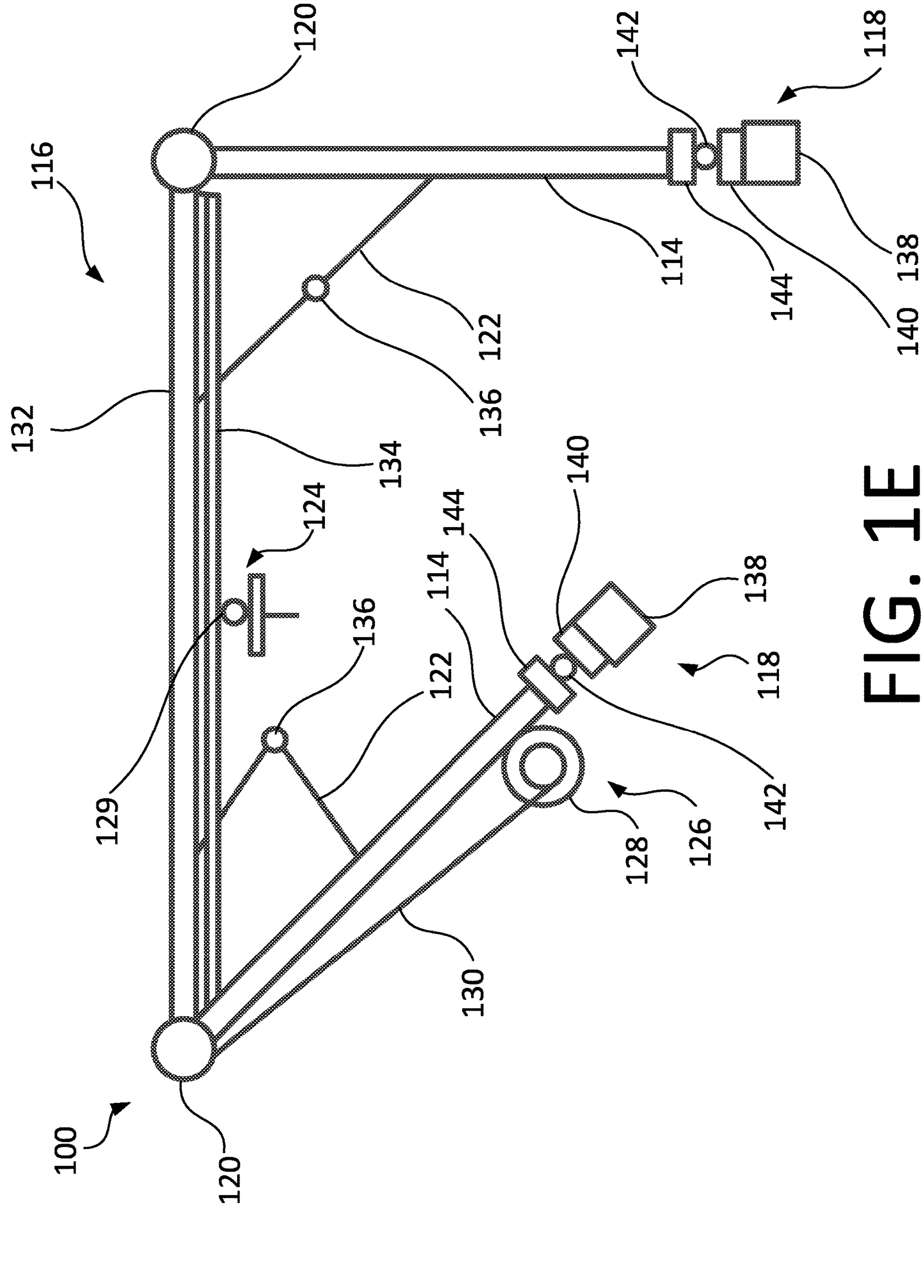
FIG. 1E is a side elevation view of the gantry of FIG. 1A in a partially collapsed state.

As shown in FIG. 1E, the frame of gantry 100 according to the illustrated example is collapsible. The frame of gantry 100 according to the illustrated example includes hinges 120 that rotatably join supports 114 to bridge 116. Hinges 120 therefore enable collapsing of gantry 100 by rotating supports 114 relative to bridge to move lower ends 144 and rails 118 closer to bridge 116. Gantry according to the illustrated example also includes bars 122 for locking the frame of gantry 100 in an unfolded or non-collapsed position, with each bar extending between a respective one of the supports 114 and a point on bridge 116. Bars 122 of the illustrated example each include a lockout gusset 136 that can either lock the bar 122 in an extended position, thereby preventing gantry 100 from collapsing, or unlock and permit bar 122 to fold by rotation of the portion of bar 122 on either side of gusset 136 to rotate relative to one another, thereby permitting gantry 100 to fold. In other examples, bars 122 may be usable to selectively lock and unlock gantry 100 in other ways. In some such other examples, bars 122 may be disconnectable from bridge 116 or supports 114 instead of or in addition to being foldable, or bars 122 may be able to separate into two portions. In yet further examples, gantry 100 may be collapsible in other ways than described above and illustrated, or gantry 100 may not be collapsible at all.

Figure 2A:
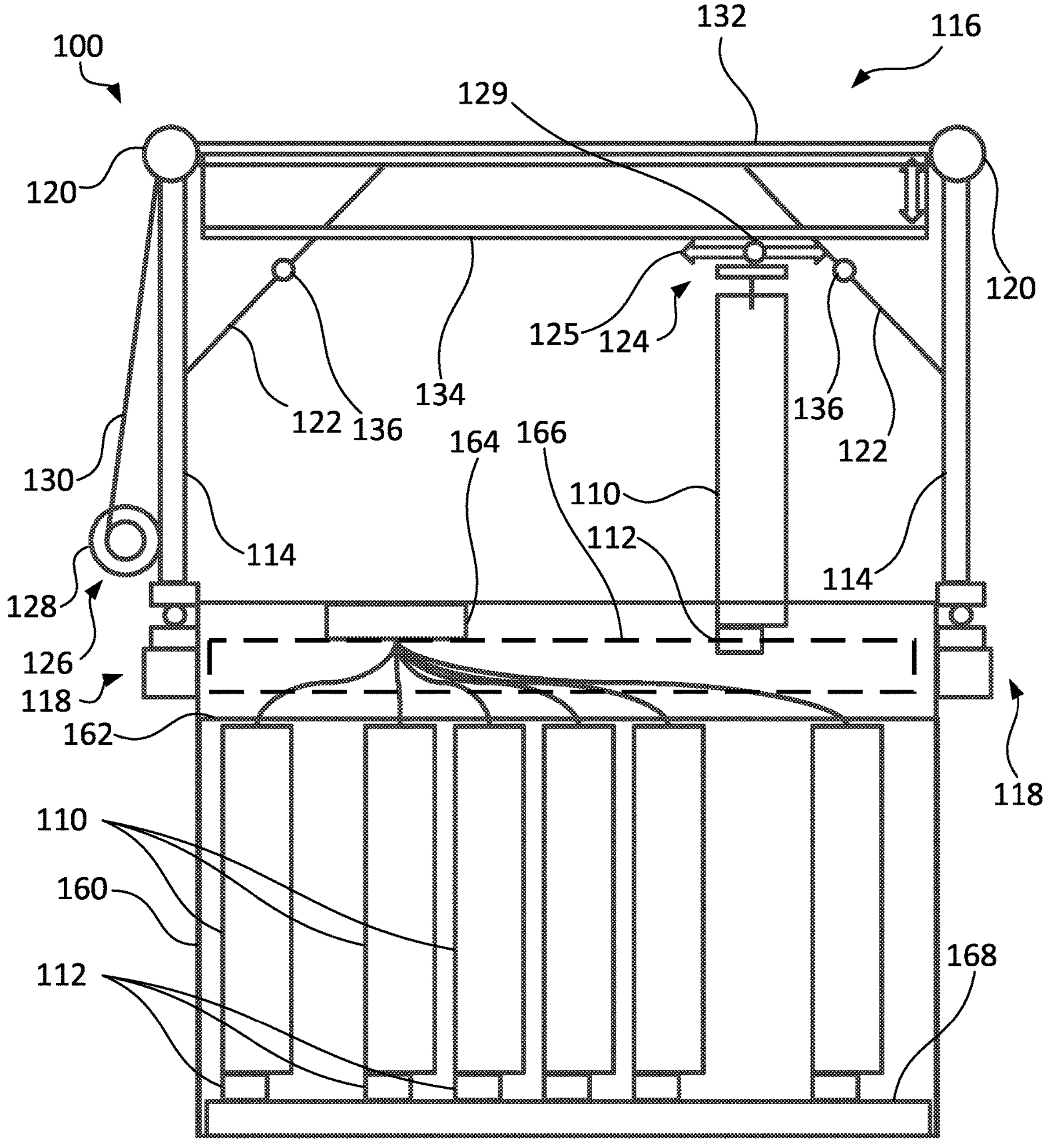
FIG. 2A is a side elevation view of an assembly including the gantry of FIG. 1A mounted to an immersion cooling tank.
Figure 2B:
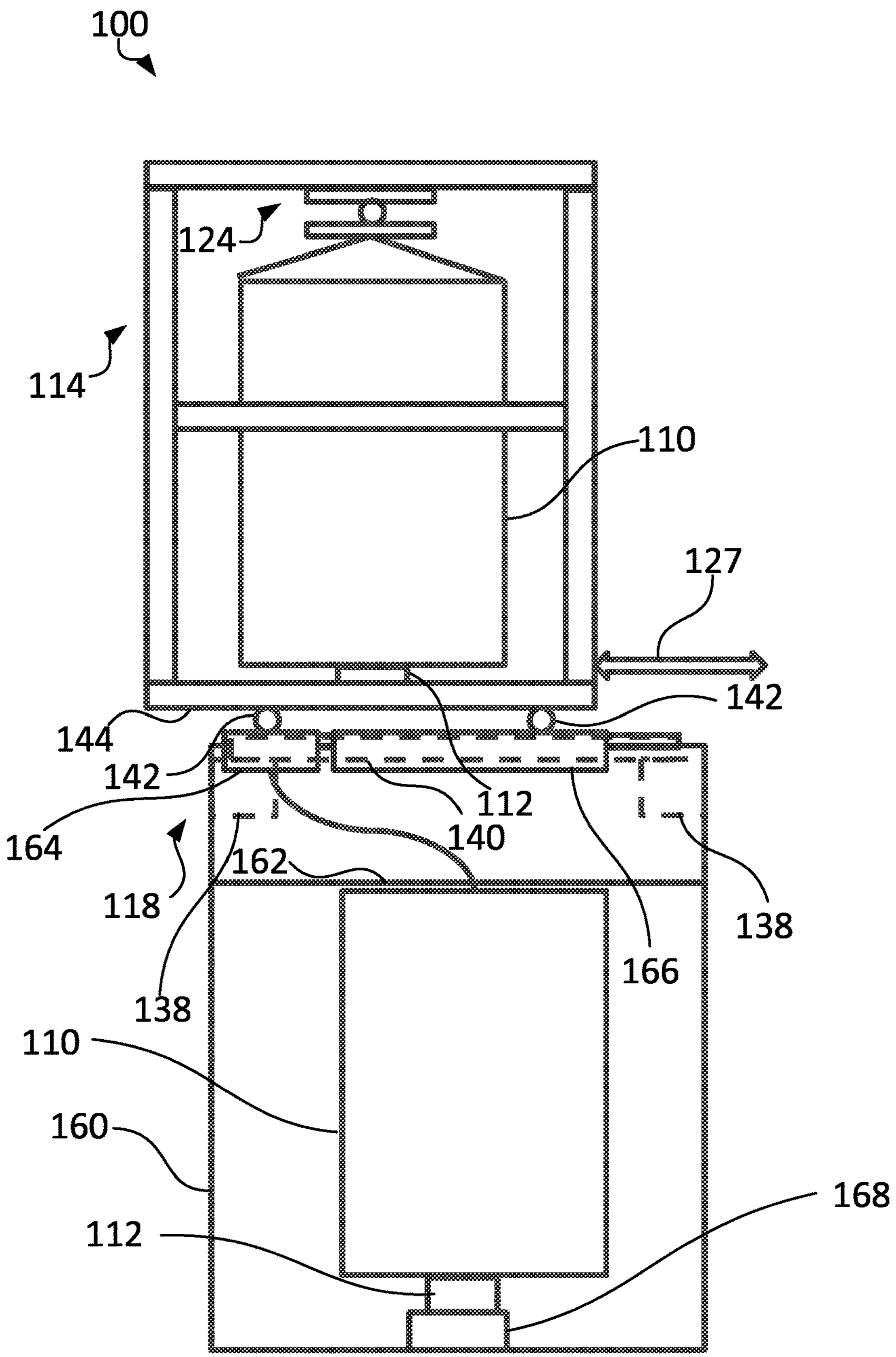
FIG. 2B is a front elevation view of the assembly of FIG. 2B.

FIGS. 2A and 2B illustrate how gantry 100 can be used to position component 100 above a tank 160 of an immersion cooling system. Tank 160 according to the illustrated example includes a communication module 164 to which components 160 in tank 160 may be wired and a heat exchanger 166 for condensing vapor from a cooling liquid 162, such as, for example, dielectric fluid. Tank 160 further includes a bus bar 168 under liquid 162 and extending along first horizontal axis 125. Each component 110 includes an electrical contact 112 at a lower end of component 110, and component 110 may be powered by depositing component 110 in tank 160 so that electrical contact 112 sits on bust bar 168. Bus bar 168 thus defines a row of possible positions at which components 110 can be deposited in tank 160. Moving connector 124 and hang point 129 along first horizontal axis 125 while a component 110 is held by connector 124 can therefore align the held component 110 with any of the multiple positions where the component 110 may be deposited in tank 160. Communication module 164, heat exchanger 166, and bus bar 168 may be repositioned or omitted without departing from the scope of the present disclosure.

Figure 2C:
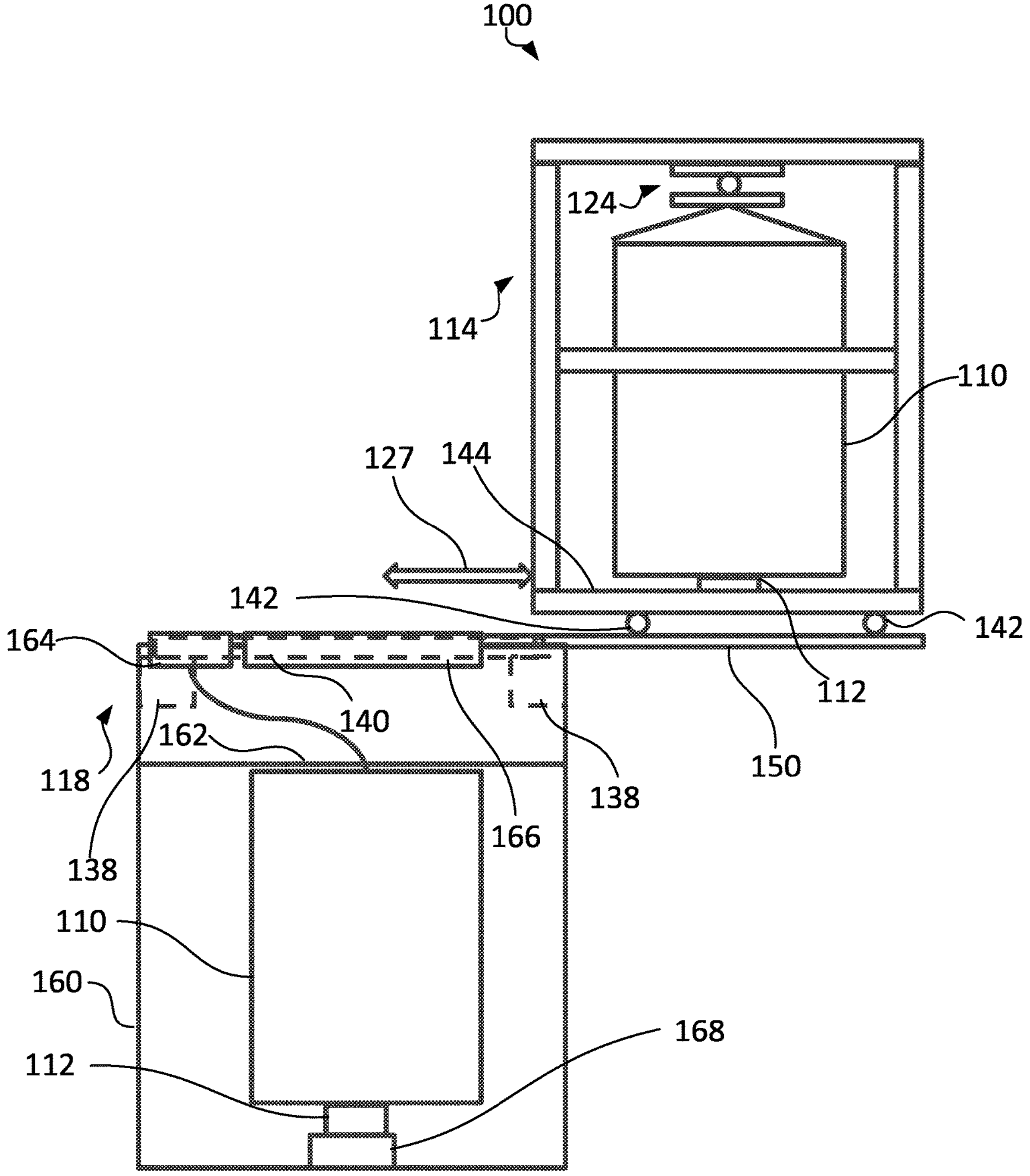
FIG. 2C is a front elevation view of the assembly of FIG. 2C with the gantry extending over a location adjacent to the tank.

FIG. 2C shows rails 118 extended on second horizontal axis 127 so that connector 124 is not positioned over tank 160. Instead, the frame of gantry 100 has moved so that connector 124 is positioned over a space adjacent to tank 160, meaning gantry 100 could be used to lift or deposit component 110 outside of tank 160. For example, connector 124 may be positioned over an aisle adjacent to tank 160. Though the illustrated example shows that rails 118 must extend to enable connector 124 to travel to a location that is not over tank 160, other examples may enable connector 124 to travel to locations not over tank 160 without rails 118 extending. Moreover, although the illustrated example shows that connector 124 travels in a direction perpendicular to first horizontal axis 125 to reach locations not over tank 160, other examples may enable connector to travel at smaller angles or parallel to first horizontal axis 125 to reach locations not over tank 160.

Figure 3:
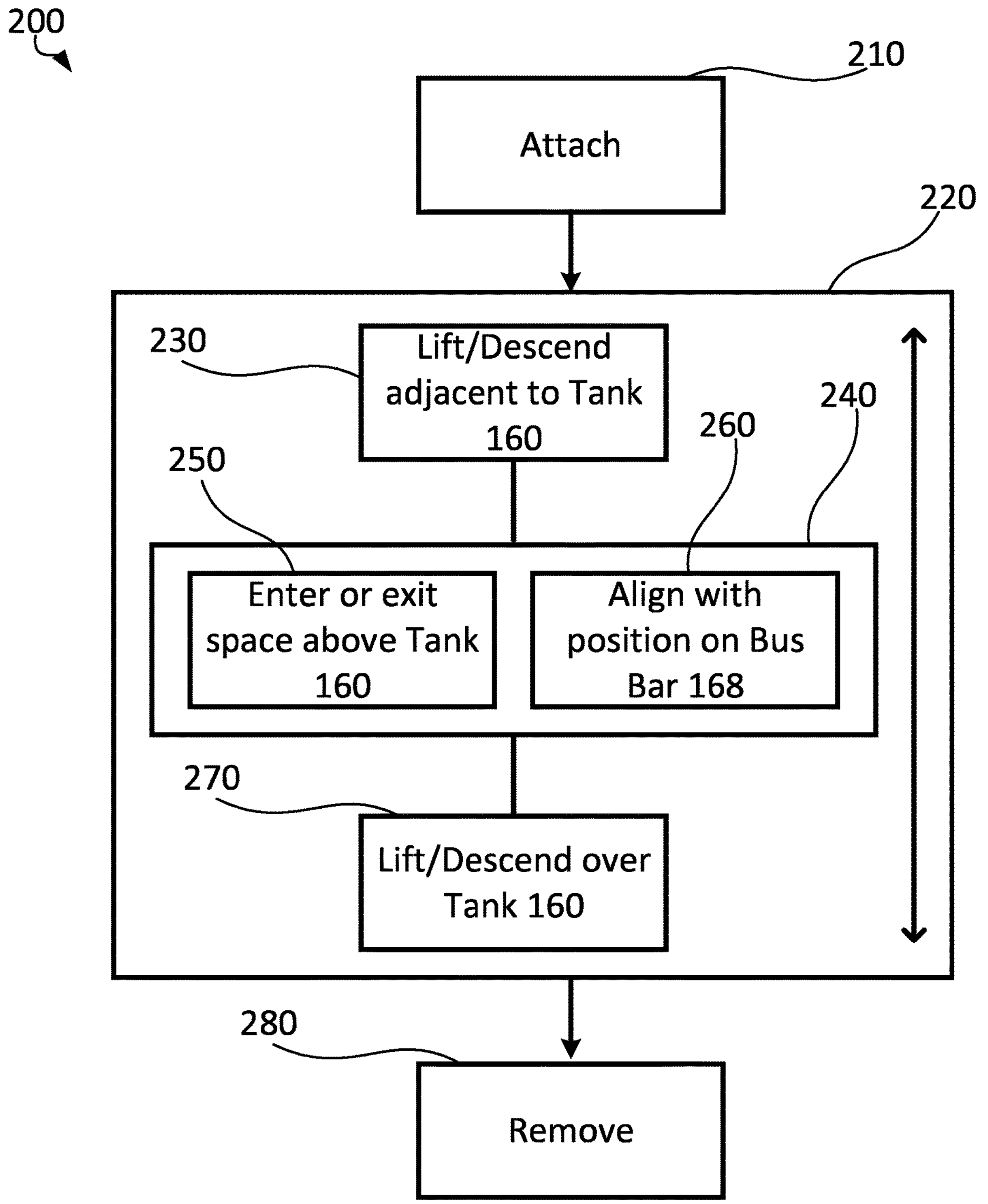
FIG. 3 illustrates an example process according to aspects of the disclosure.

FIG. 3 illustrates a process 200 for using gantry 100. Process 200 includes attachment 210, wherein gantry 100 is attached to tank 160. Attachment 210 is followed by transport stage 220 in which gantry 100 is used to move components 110. Transport stage 220 includes first vertical movement 230, which is raising or lowering connector 124 at locations adjacent to tank 160, and second vertical movement 270, which is raising or lowering connector 124 at locations above or within tank 160.

Horizontal movements 240 of connector 124 are also included in transport stage 220 and occur between first vertical movement 230 and second vertical movement 270. In the illustrated example, horizontal movements 240 include crossing 250 of connector 124 parallel to second horizontal axis 127 and perpendicular to bus bar 168 and alignment 260 of connector 124 parallel to first horizontal axis 125 and bus bar 168. Crossing 250 parallel to second horizontal axis 127 can pass connector 124 over an edge of tank 160, thereby either moving connector 124 from being over tank 160 to being over a space adjacent to tank 160 or moving connector 124 from being over a space adjacent to tank 160 to being over tank 160. Thus, crossing 250 can either bring a component 110 that has been retrieved from outside tank 160 to a position over tank 160 or bring a component 110 that has been lifted out of tank 160 to a location adjacent tank 160. Alignment 260 parallel to first horizontal axis 127 can be used to align connector 124 and component 110 over any of the possible positions along bus bar 168 at which component 110 may be deposited in tank 160. Crossing 250 and aligning 260 can be performed in any order, simultaneously, or at overlapping times. In some instances, aligning 260 may be omitted altogether. In examples other than the illustrated example, crossing 250 and aligning 260 may be movements along parallel axes.

Transport stage 220 may be repeated any number of times before removal 280 of gantry 100 from tank 160. Further, any iteration of transport stage 220 can be performed in the order of first vertical movement 230, then horizontal movements 240, then second vertical movement 270 or in the order of second vertical movement 270, then horizontal movements 240, then first horizontal movement 230. Any, some, or all portions of movement phase 220 may be performed manually or driven by a motor, such as by a digitally controlled motor. Use of gantry 100 according to process 200 can provide mechanical advantage or motorized assistance for movement of components 110 into or out of tank 160, making exchange or rearrangement of components 110 less difficult. Gantry 100 may also reduce the need to reach into tank 160, reducing the exposure of human operators to the dielectric fluid 162. Thus, use of gantry 100 can also shorten or avoid downtime needed to allow dielectric fluid 162 to cool before components 110 can be accessed. Gantry 100 can also be used to rearrange components 100 within tank 160 without carrying any components 110 horizontally out of tank 160.

Although the concept herein has been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

The invention claimed is:

1. A gantry crane for attachment to an immersion cooling system, the gantry crane comprising:
- rails attachable to a tank;
- a collapsible frame configured to travel along the rails;
- a connector adapted for connecting to a computer hardware component; and
- a winch mounted to the frame and configured to raise and lower the connector,
- wherein the frame comprises two supports,
- an upper beam to which both of the supports are connected and extending along a first longitudinal axis, and a lower beam that hangs from the upper beam, the lower beam extending between a first end and a second end along a second longitudinal axis parallel to the first longitudinal axis,
- wherein the winch is configured to raise and lower the lower beam relative to the upper beam, and
- wherein the connector is configured to move along the lower-bridge beam along the second longitudinal axis between the first end and the second end.

2. The gantry crane of claim 1, wherein the connector is a bracket.

3. The gantry crane of claim 1, wherein the connector is a pair of jaws.

4. The gantry crane of claim 1, wherein the rails are extendable.

5. The gantry crane of claim 1, wherein each of the rails includes a fixed track, and the frame includes a movable track for each fixed track, and each movable track is movably connected to a respective one of the fixed tracks.

6. The gantry crane of claim 1, wherein the connector is connected to the lower beam.

7. A gantry crane for attachment to an immersion cooling system, the gantry crane comprising:
- rails attachable to a tank;
- a collapsible frame configured to travel along the rails;
- a connector adapted for connecting to a computer hardware component; and
- a winch mounted to the frame and configured to raise and lower the connector,
- wherein the frame comprises a first support, a second support, a first hinge, a second hinge, and a bridge, the first support comprising a first lower end and the second support comprising a second lower end, and
- wherein the first support is pivotably directly connected to the bridge via the first hinge and the second support is pivotably directly connected to the bridge via the second hinge at a different location such that at least one of the first lower end and the second lower end is configured to be rotated closer to the bridge, and the connector hangs directly from the bridge.

8. The gantry crane of claim 7, wherein the connector is movable along the bridge.

9. The gantry crane of claim 8, wherein the connector is movable along the bridge in a first direction that is perpendicular to a second direction in which the frame may travel along the rails.

10. The gantry crane of claim 7, wherein the supports each include a first end pivotably connected to the bridge and a second end that is opposite the first end and configured to travel along one of the rails.

11. The gantry crane of claim 10, wherein each second end is connected to a respective one of the rails.

12. The gantry crane of claim 7, comprising a bar extending between the bridge and one of the supports.

13. The gantry crane of claim 12, wherein the bar is collapsible.

* * * * *